United States Patent [19]

Wamstad et al.

[11] Patent Number: 4,502,335

[45] Date of Patent: Mar. 5, 1985

[54] FLUID PRESSURE TRANSMITTER ASSEMBLY

[75] Inventors: David B. Wamstad, Roseville, Minn.; Douglas W. Wilda, Ambler, Pa.

[73] Assignee: Honeywell Inc., Minneapolis, Minn.

[21] Appl. No.: 491,613

[22] Filed: May 4, 1983

[51] Int. Cl.³ .............................................. G01L 9/06
[52] U.S. Cl. ........................................ 73/721; 73/727; 338/4
[58] Field of Search ................ 73/717, 718, 719, 720, 73/721, 722, 723, 724, 725, 726, 727, 728, 708, 707, 706, 739, 756; 338/4

[56] References Cited

U.S. PATENT DOCUMENTS 3,817,107 7/1974 Shimada et al. .................... 73/727

Primary Examiner—Donald O. Woodiel
Attorney, Agent, or Firm—Mitchell J. Halista; Trevor B. Joike

[57] ABSTRACT

A fluid differential pressure transmitter assembly includes a pressure sensor housing having a spacer within the housing to minimize the internal fill fluid used to conduct fluid pressure from a fluid inlet port to a pressure sensor located within the housing in the form of a pressure responsive diaphragm. Input pressures are applied to respective sides of the diaphragm to produce an electrical signal output representative of the differential pressure from piezoresistive elements deposited on the diaphragm. The sensor is electrically connected by flexible wires to electrically conductive paths supported on an end surface of the spacer. The conductive paths are, in turn, electrically connected to electrode wires at electrically conductive support junctions between the spacer and the electrode wires. However, the spacer is supported on the electrode wires at the support junctions in a free floating arrangement without any other physical contact to either adjacent elements within the housing or the interior wall of the housing. Thus, physical changes to the spacer such as those occasioned by temperature changes are not transmitted to the fluid seals. The electrode wires are arranged to pass through fluid-tight seals in the transmitter housing to provide external electrical connections to the sensor while supporting the spacer within the housing.

10 Claims, 1 Drawing Figure

U.S. Patent     Mar. 5, 1985     4,502,335
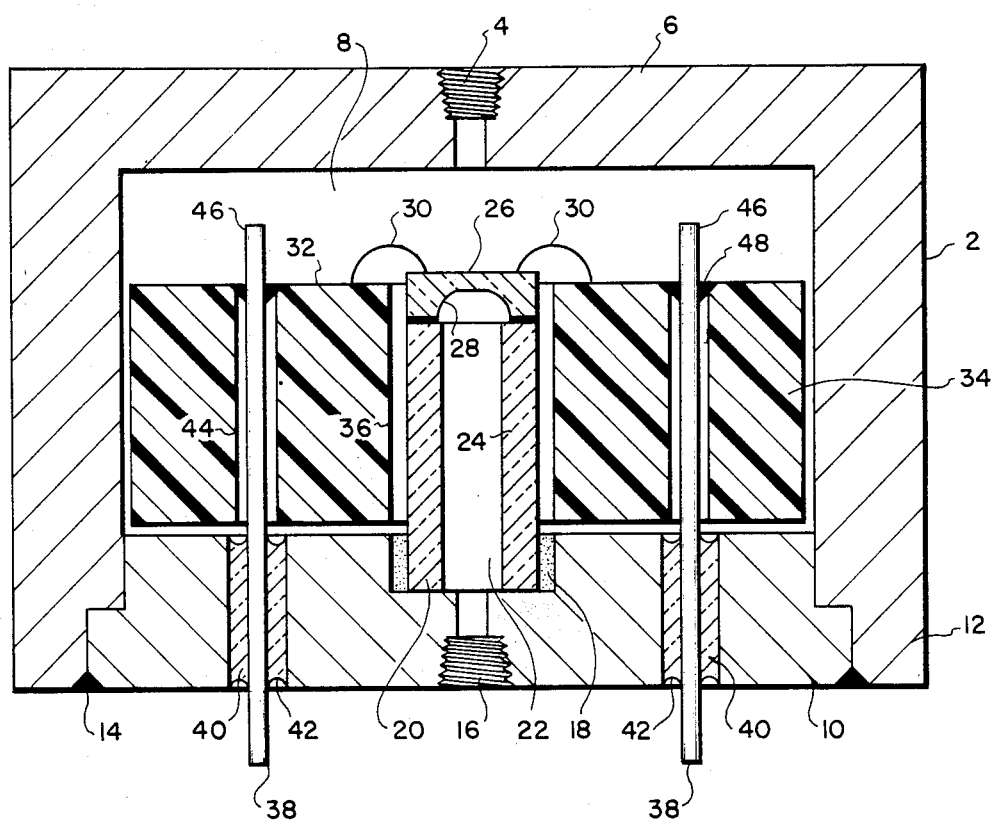

FLUID PRESSURE TRANSMITTER ASSEMBLY

BACKGROUND OF THE INVENTION

1. Field of the Invention

The present invention is directed to fluid pressure transmitters. More specifically, the present invention is directed to a fluid pressure transmitter assembly.

SUMMARY OF THE INVENTION

An object of the present invention is to provide an improved fluid pressure transmitter assembly.

In accomplishing this and other objects, there has been provided, in accordance with the present invention, a fluid pressure transmitter assembly having a pressure sensor, a sensor housing for the pressure sensor, a spacer located within the housing and support means for supporting the sensor as a free floating body within the housing with a support connection to one end of the spacer.

BRIEF DESCRIPTION OF THE DRAWING

A better understanding of the present invention may be had when the following detailed description is read in connection with the accompanying drawing, in which the single FIGURE is a cross section illustration of a fluid pressure transmitter assembly embodying an example of the present invention.

DESCRIPTION OF PREFERRED EMBODIMENT

Detailed Description

Referring to the single FIGURE drawing in more detail, there is shown a fluid pressure transmitter assembly embodying an example of the present invention in the form of a differential pressure transmitter and having an outer cup shaped housing 2. A first fluid inlet port 4 is provided in an end wall 6 of the housing 2 to enable a first input pressure to be admitted into an interior volume or cavity 8 defined by the housing 2. A cover 10 for an open end 12 of the housing 2 is attached thereto by any suitable means providing a fluid-tight seal, e.g., an electron beam weld 14. A second fluid inlet port 16 is provided in the cover 10 to allow the admission of a second input fluid pressure into the housing 2. The cover 10 is provided with a circular recess 18 coaxial with the second fluid inlet port 16. A hollow support tube 20 has a first end coaxially mounted within the recess 18 and is bonded to the adjacent side wall of the recess 18 by any suitable means, e.g. an adhesive, to provide a fluid-tight seal thereto. A fluid conduit 22 within the tube 20 is aligned with the second fluid port 16 to conduct a fluid admitted by the second port 16.

A second end 24 of the tube 20 is used to support a pressure sensor in the form of a diaphragm 26 which is secured at its peripheral edge 28 to the second end 24 of the tube 20. The attachment of the diaphragm 26 to the tube 20 is arranged to provide a fluid-tight seal between the diaphragm 26 and the tube 20. The diaphragm 26 has a pressure sensitive coating thereon which may be in the form of piezo-resistive elements, in a manner well-known in the art. These diaphragm elements are attached to one end of respective ones of a plurality of flexible wires 30 which provide electrical connections thereto. The other ends of the wires 30 are connected to respective ones of electrically conductive paths supported on a first end surface 32 of a spacer 34 located within the interior volume 8 defined by the housing. The spacer 34 is preferably in the form of a cylindrical element coaxial with the tube 20 and having an axial aperture 36 encircling the tube 20 and spaced from the tube 20.

A plurality of electrically conductive and relatively rigid electrode wires 38 are arranged to pass through holes 40 in the cover 10. Hermetic seals 42 are located between the wires 38 and the surfaces of the cover 10 surrounding the holes 38 to provide fluid-tight connections thereto. The wires 38 extend into the housing cavity 8 and pass through respective ones of a plurality of bores 44 in the spacer 34 which coaxially surround each of the corresponding ones of the electrode wires 38 while being spaced therefrom. The free ends 46 of the electrode wires 38 within the housing 2 are rigidly attached to the first end surface 32 of the spacer 34 by any suitable means to provide mechanical and electrical connections 48 thereto, e.g., or soldering. The connections 48 are arranged to provide a support junction for the spacer 34 and to provide a current path between the electrode wires 38 and the aforesaid electrically conducting paths on the end surface 32 of the spacer 34 which, in turn, as previously described, are connected to the wires 30 leading to the diaphragm pressure sensor 26.

The spacer 34 is arranged to be a free floating element within the cavity 8 of the housing 2 and is, accordingly, spaced from the interior walls of the housing 6, the cover 10, the electrode wires 38, the support tube 20 and the diaphragm 26. Thus, the spacer 34 is suspended from the connections 48 to the electrode wires 38 whereby temperature changes in the environment of the pressure transmitter which can produce physical changes in the dimensions of the spacer 34 based on the coefficient of temperature expansion of the spacer 34 do not affect the hermetic seals 40, i.e., the hermetic seals 40 are not stressed by temperature induced expansions and contractions of the spacer 34. The spacer 34 is used to reduce the volume within the housing 2 to minimize the amount of a fill fluid (not shown) needed for transmitting the first input pressure to one side of the sensor diaphragm 26. A first fill fluid would be arranged to fill the cavity 8 within the housing 2 while a second fill fluid (not shown) would be arranged to fill the fluid conduit 22 within the tube 20 to transmit a second input pressure to the other side of the sensor diaphragm 26. Concurrently, the spacer 34 provides a support for the electrical connections between the flexible wires 30 and the electrode wires 38. The illustrated size relative and shape of the spacer 34 is only intended to provide an example of the present invention since the size and shape thereof may be modified to conform the spacer 34 to the operating requirements of the transmitter. For example, in a transmitter to be used to withstand accelerating and decelerating forces, i.e., "g" forces, the spacer may be made thinner to provide less inertial mass. However, the free-floating relationship described above would be maintained.

Accordingly, it may be seen that there has been provided, in accordance with the present invention an improved fluid pressure transmitter assembly.

The embodiments of the invention in which an exclusive property or privilege is claimed are defined as follows:

1. A pressure transmitter comprising
   a housing means defining an internal volume,
   a pressure sensor means mounted within said internal volume of said housing means, a spacer within said internal volume of said housing means and support means for supporting said spacer as a free floating body within said housing and spaced from said sensor means and all internal surfaces defining said internal volume of said housing means with a support connection between said support means and said spacer at one end surface of said spacer.

2. A transmitter as set forth in claim 1 wherein said support means includes electrically conductive wires and said housing means includes hermetic seals for allowing one end of said wires to extend out of said housing while the other end of said wires is attached to said one end of said spacer.

3. A transmitter as set forth in claim 2 wherein sensor means includes electrical connection means supported on said one end of said spacer and electrically connected to said wires.

4. A transmitter as set forth in claim 3 wherein said connection means includes at least one electrical conductor mounted on said one end of said spacer and an electrical junction connecting said conductor to a respective one of said wires.

5. A transmitter as set forth in claim 4 wherein said sensor means further includes a pressure sensor and at least one flexible wire connecting said sensor to said electrical conductor.

6. A transmitter as set forth in claim 5 wherein said sensor means further includes a sensor mounting tube arranged to support said pressure sensor and said spacer encircles said tube and is coaxial with said tube while being spaced therefrom.

7. A transmitter as set forth in claim 1 wherein said housing means includes at least one fluid inlet means for admitting an input fluid pressure to said sensor means.

8. A transmitter as set forth in claim 7 wherein said housing means includes a second fluid inlet means for admitting a second input fluid pressure to said sensor means.

9. A transmitter as set forth in claim 8 wherein said second fluid inlet means is arranged to admit said second input fluid pressure to an interior volume of said mounting tube.

10. A transmitter as set forth in claim 6 wherein said sensor means further includes adhesive means for providing a fluid-type seal between said pressure sensor and said mounting tube.

* * * * *